US009936579B2

(12) United States Patent
Akre et al.

(10) Patent No.: US 9,936,579 B2
(45) Date of Patent: Apr. 3, 2018

(54) LOW PROFILE PACKAGING AND ASSEMBLY OF A POWER CONVERSION SYSTEM IN MODULAR FORM

(71) Applicant: Apple Inc., Cupertino, CA (US)

(72) Inventors: Sunil M. Akre, Cupertino, CA (US); Shawn X. Arnold, San Jose, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 14/163,852

(22) Filed: Jan. 24, 2014

(65) Prior Publication Data

US 2014/0218155 A1 Aug. 7, 2014

Related U.S. Application Data

(60) Provisional application No. 61/759,970, filed on Feb. 1, 2013.

(51) Int. Cl.
| | |
|---|---|
| *H05K 3/30* | (2006.01) |
| *H01F 27/29* | (2006.01) |
| *H01F 27/02* | (2006.01) |
| *H01F 27/24* | (2006.01) |
| *H05K 1/14* | (2006.01) |
| *H05K 1/16* | (2006.01) |
| *H05K 1/18* | (2006.01) |

(52) U.S. Cl.
CPC ............ *H05K 1/141* (2013.01); *H05K 1/144* (2013.01); *H05K 1/165* (2013.01); *H05K 1/185* (2013.01); *H05K 2201/086* (2013.01); *Y10T 29/4913* (2015.01)

(58) Field of Classification Search
CPC ...... H01F 27/292; H01F 27/027; H01F 27/24; H05K 1/303
USPC .................... 336/192; 29/832; 257/678, 227; 438/122
See application file for complete search history.

(56) References Cited

U.S. PATENT DOCUMENTS

| | | | | |
|---|---|---|---|---|
| 2006/0092079 | A1* | 5/2006 | de Rochemont | H01Q 1/362 343/700 MS |
| 2007/0035013 | A1* | 2/2007 | Handa et al. | 257/717 |
| 2008/0029907 | A1* | 2/2008 | Koduri | H01F 17/045 257/784 |
| 2009/0134503 | A1* | 5/2009 | Feng | H01F 17/0033 257/673 |
| 2009/0243780 | A1* | 10/2009 | Inoue | H01F 1/15366 336/200 |
| 2010/0087036 | A1* | 4/2010 | Lotfi | H01L 23/49589 438/122 |

(Continued)

*Primary Examiner* — Moazzam Hossain
(74) *Attorney, Agent, or Firm* — Kilpatrick Townsend & Stockton

(57) ABSTRACT

Embedded PCB (printed circuit board) is used for the packaging and assembly of a low profile power conversion system module that can be employed in space constrained environment of small computer/electronic systems. The low profile power conversion system module includes an embedded PCB, a power silicon device embedded within the PCB, a magnetic component which is either embedded within the PCB or disposed on the PCB, and input/output terminals disposed on the side of the embedded PCB. The embedded PCB and the magnetic component are thin planar shaped to save vertical space. The low profile power conversion system module can be placed inside a cavity formed in the system PCB to save even more vertical space.

20 Claims, 24 Drawing Sheets

Cross Sectional View
(Module with filter tile and protruding input/output terminals connected to system PCB)

(56) References Cited

U.S. PATENT DOCUMENTS

| | | | |
|---|---|---|---|
| 2011/0134613 A1* | 6/2011 | Moussaoui | H01L 23/3107 361/737 |
| 2012/0069529 A1* | 3/2012 | Chen | H01L 23/552 361/729 |
| 2012/0217614 A1* | 8/2012 | Burgyan et al. | 257/531 |
| 2013/0062419 A1* | 3/2013 | Finn | G06K 19/07718 235/492 |
| 2014/0232192 A1* | 8/2014 | Corum | H02J 3/18 307/43 |
| 2015/0049891 A1* | 2/2015 | Johnson | H04R 25/554 381/315 |

* cited by examiner

Cross Sectional View
(Magnetic Component)

Side View

Side View

Cross Sectional View
(System PCB with cavity)

Cross Sectional View
(System PCB with cavity)

Cross Sectional View
(Module with protruding input/output terminals connected to system PCB)

Cross Sectional View
(Module with filter tile and protruding input/output terminals connected to system PCB)

Cross Sectional View

Cross Sectional View
(Module with filter tile and protruding input/output terminals connected to system PCB with a cavity)

LOW PROFILE PACKAGING AND ASSEMBLY OF A POWER CONVERSION SYSTEM IN MODULAR FORM

CROSS-REFERENCE TO RELATED APPLICATIONS

This application claims priority to U.S. Provisional Application No. 61/759,970, filed Feb. 1, 2013 and entitled "LOW PROFILE PACKAGING AND ASSEMBLY OF A POWER CONVERSION SYSTEM IN MODULAR FORM", which is incorporated herein in its entirety by reference.

FIELD

The described embodiments relate generally to a power conversion system module and more particularly to packaging and assembly of a low profile power conversion system module.

BACKGROUND

Isolated and non-isolated power conversion systems include point-of-load DC/DC (direct current/direct current) converter, LED/LCD (light-emitting diode/liquid crystal display) driver, battery chargers, AC/DC (alternating current/direct current) adapters, and others. These isolated and non-isolated power conversion systems operating in space constrained (e.g., restricted height) environment such as ultraportable notebook computers, tablet computers, and smartphones face special dimensional requirements. Current off the shelf components are designed to maintain industry standard footprint, so they do not meet such height restriction. The space constrained environment of these small computer/electronic systems also introduces additional challenges, such as dissipation of heat generated by the power converter and EMI (electromagnetic interference) problems associated with tightly positioned components.

Therefore, what is desired is the packaging and assembly of a low profile power conversion system module that can be employed to many space constrained applications. It is further desired that the shape, height and electrical specifications of a low profile power conversion system module be highly optimized and tailored to specific needs.

SUMMARY

This specification describes various embodiments that relate to methods and systems for packaging and assembly of a low profile power conversion system module that can be employed to operate in space constrained (e.g., restricted z height) environment such as ultraportable notebook computers, tablet computers, and smartphones. In one embodiment, the shape, height and electrical specifications of a low profile power conversion system module can be highly optimized and tailored to specific needs. For example, a low profile power conversion system module can be thin planar shaped to save vertical space.

In one embodiment, the low profile power conversion system module can include an embedded PCB (printed circuit board), a power silicon device embedded within the PCB, a magnetic component which is either embedded within the PCB or disposed on the PCB, and input/output terminals disposed on the side of the embedded PCB. The embedded PCB and the magnetic component can be thin planar shaped to save vertical space (i.e., z height). The low profile power conversion system module can be placed inside a cavity formed in the system PCB to save even more vertical space.

In one embodiment, the low profile power conversion system module can be configured on a system PCB. Aside from saving vertical space through a thin planar-shaped design, novel compact design of the low profile power conversion system module can also help to save occupied area (i.e., two-dimensional x-y space) on the system PCB.

In one embodiment, a low profile power conversion system module is disclosed. The low profile power conversion system module includes an embedded power substrate, an embedded power silicon disposed within the embedded power substrate, a magnetic component disposed on top of the embedded power substrate, and input/output terminals disposed on the side of the embedded power substrate. The embedded power substrate and the magnetic component are thin planar-shaped. The input/output terminals are configured to supply power and signal to the embedded power silicon and the magnetic component. In one embodiment, the embedded power substrate includes PCB (printed circuit board). In one embodiment, the low profile power conversion system module further includes an embedded passive component disposed within the embedded power substrate. In one embodiment, the magnetic component includes a magnetic core with embedded winding. In one embodiment, the input/output terminals are co-planar with the embedded power substrate. In another embodiment, the input/output terminals are protruding above the embedded power substrate. In one embodiment, the power conversion system module is disposed on a top surface of a system PCB (printed circuit board). In another embodiment, the power conversion system module is disposed on a bottom surface of a system PCB. In yet another embodiment, the power conversion system module is disposed to be partially within an opening formed in a system PCB.

In one embodiment, a method for using a low profile power conversion system module is disclosed. The method includes providing the low profile power conversion system module and configuring the low profile power conversion system module on a system PCB (printed circuit board). The low profile power conversion system module includes an embedded power substrate, an embedded power silicon disposed within the embedded power substrate, a magnetic component disposed on top of the embedded power substrate, and input/output terminals disposed on the side of the embedded power substrate. The embedded power substrate and the magnetic component are thin planar-shaped. The input/output terminals are configured to supply power and signal to the embedded power silicon and the magnetic component. In one embodiment, the low profile power conversion system module further includes an embedded passive component disposed within the embedded power substrate. In one embodiment, the magnetic component includes a magnetic core with embedded winding. In one embodiment, the input/output terminals are co-planar with the embedded power substrate. In another embodiment, the input/output terminals are protruding above the embedded power substrate. In one embodiment, the power conversion system module is disposed on a top surface of the system PCB. In another embodiment, the power conversion system module is disposed on a bottom surface of a system PCB. In yet another embodiment, the power conversion system module is disposed to be partially within an opening formed in a system PCB.

In one embodiment, a power conversion device is disclosed. The power conversion device includes an embedded power substrate, a power silicon disposed within the embedded power substrate, a magnetic component disposed within the embedded power substrate, and input/output terminals disposed on the side of the embedded power substrate. The embedded power substrate is thin planar-shaped. The input/output terminals are configured to supply power and signal to the power silicon and the magnetic component. In one embodiment, the embedded power substrate includes PCB (printed circuit board). In one embodiment, the magnetic component includes a magnetic core with embedded winding.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The following is related to packaging and assembly of a low profile power conversion system module that can be employed to many space constrained applications involving isolated and non-isolated power conversion systems, such as point-of-load DC/DC (direct current/direct current) converter, LED/LCD (light-emitting diode/liquid crystal display) driver, battery chargers, AC/DC (alternating current/direct current) adapters, transformers, and others. An embodiment of such a low profile power conversion system module is shown in FIGS. 1A-1D.

Figure 1A:
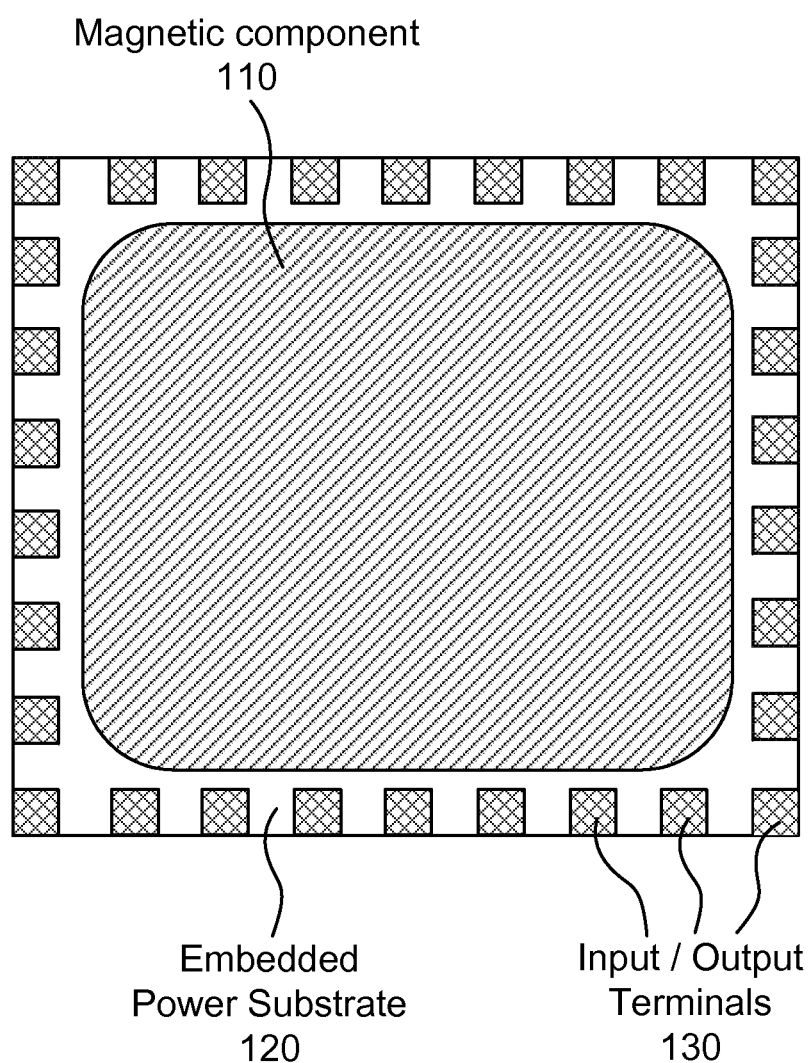
FIG. 1A illustrates a top view of a low profile power conversion system module, in accordance with some example embodiments.

FIG. 1A illustrates a top view of an embodiment of a low profile power conversion system module 100. In this embodiment, a magnetic component 110 shaped as a rectangular plane with rounded corners sits on top of an embedded power substrate 120 shaped as a rectangular plane with sharp corners. Input/output terminals 130, shaped as many small squares, can be seen disposed on all four rectangular sides of the embedded power substrate. In this embodiment, the magnetic component 110 and the embedded power substrate 120 are shown as a rectangular shape, but in other embodiments, other shapes can also be possible. The key is that the shape, height and electrical specifications of the magnetic component 110 and the embedded power substrate 120 can be optimized and tailored to specific needs, such as the space constrained environment of the small computer/electronic systems using the low profile power conversion system module 100.

Figure 1B:
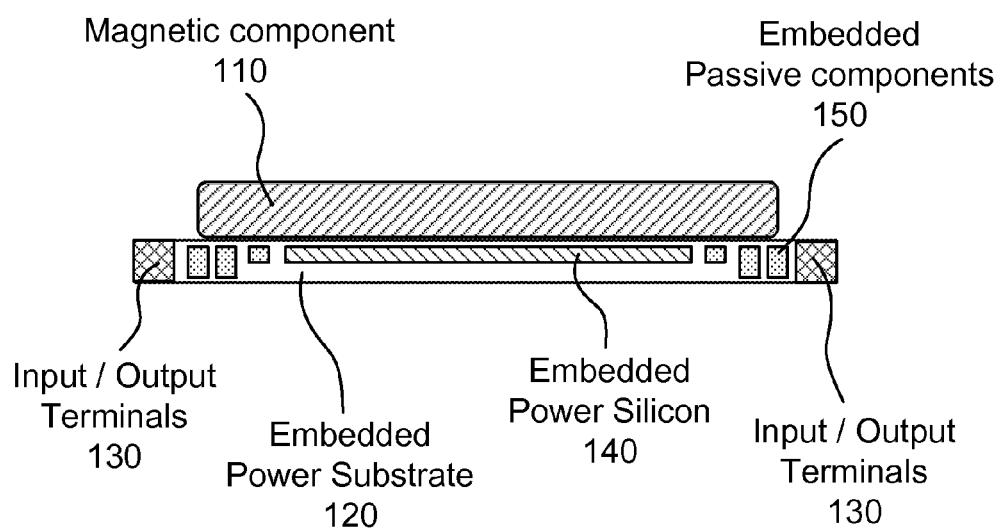
FIG. 1B illustrates a cross sectional view of the low profile power conversion system module shown in FIG. 1A, in accordance with some example embodiments.

FIG. 1B illustrates a cross sectional view of the low profile power conversion system module 100 shown in FIG. 1A. In this embodiment, the low profile power conversion system module 100 includes an embedded power substrate 120 that is thin planar-shaped. An embedded power silicon 140 is disposed within the embedded power substrate. Input/output terminals 130 are disposed on the side of the embedded power substrate 120. A magnetic component 110 is disposed on top of the embedded power substrate 120. The magnetic component 110 is also thin planar-shaped. The embedded power substrate 120 can be standard PCB (printed circuit board) material or ceramic. In one embodiment, the embedded power silicon 140 can be a switching power device. Switching power devices and other active/passive components, such as embedded passive component 150, are embedded inside the substrate, enabling substantial reduction in electrical interconnects. Top and bottom surface of the substrate 120 are available for 3-D (three-dimensional) assembly of the module. In this embodiment, a magnetic component 110 is assembled on top of the embedded power substrate 120. The magnetic component 110 can include the inductor of a transformer. Input/output terminals (or pins) 130 carry power and input/output signals. Input/output terminals 130 can enable electrical connections to embedded switching power devices and other active/passive devices, as well as to the magnetic component 110. The number of input/output terminals can be varied and determined based on the particular application of the power conversion system module. In FIG. 1A, the number of input/output terminals 130 shown is thirty, but in other embodiments, other numbers of input/output terminals 130 are possible. It depends on the particular application of the power conversion system module 100 and the details of the small computer/electronic systems using the low profile power conversion system module 100. But, in general, input/output terminals on the outside side of the module 100, as shown in FIGS. 1A and 1B, allow for easy coupling to other devices.

Figure 1C:
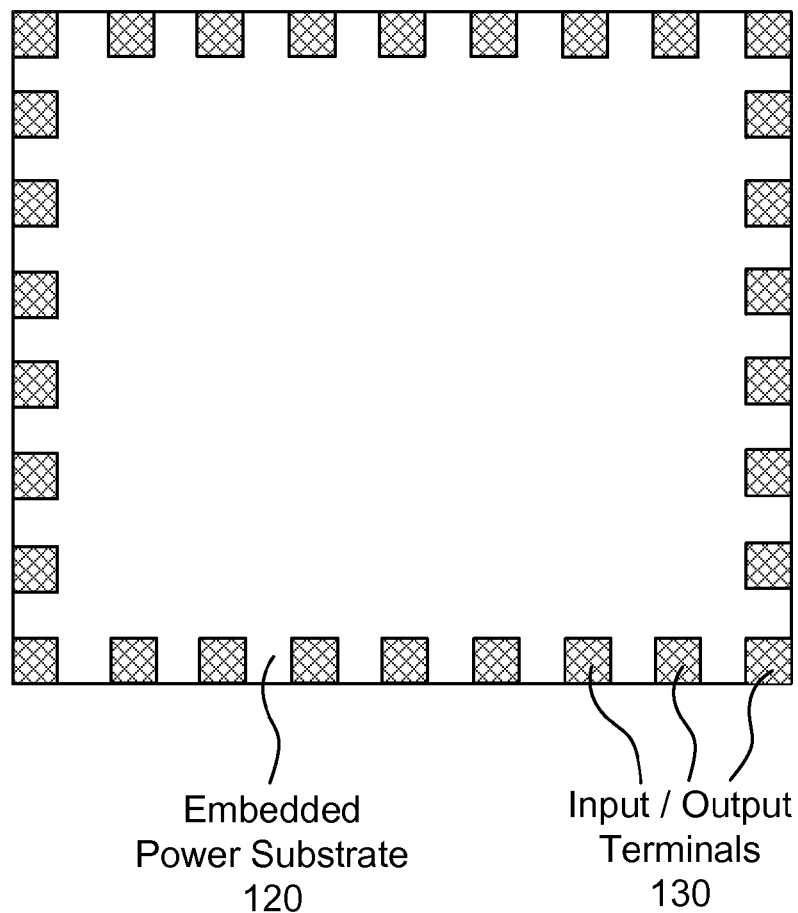
FIG. 1C illustrates a bottom view of the low profile power conversion system module shown in FIG. 1A, in accordance with some example embodiments.

FIG. 1C illustrates a bottom view of the low profile power conversion system module 100 shown in FIG. 1A. In this embodiment, the embedded power substrate is 120 seen as a rectangle with sharp corners. Input/output terminals 130, shaped as many small squares, can be seen disposed on all sides of the embedded power substrate 120. In other embodiments, there can be additional passive/active components disposed on the bottom face of the embedded power substrate which will show up in the bottom view, but in this embodiment there are none. Further, in this embodiment, the magnetic component 110 is disposed on top of the embedded power substrate 120, so it does not appear in the bottom view of FIG. 1C.

Figure 1D:
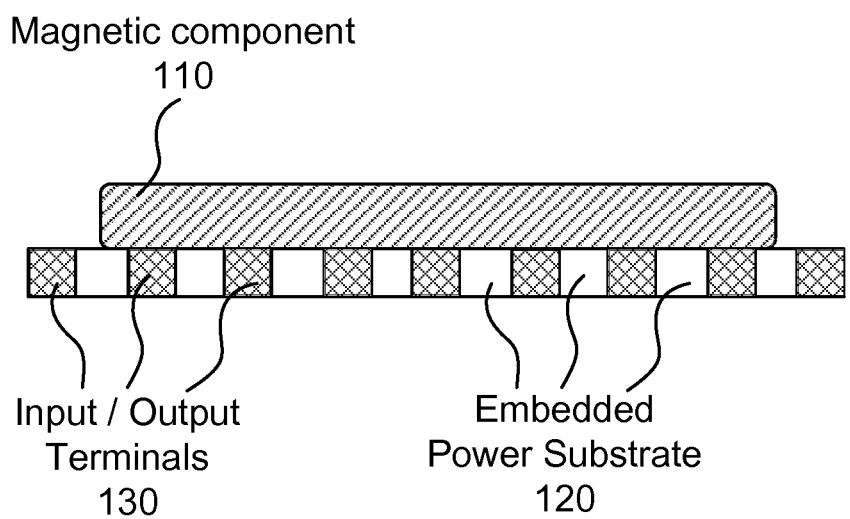
FIG. 1D illustrates a side view of the low profile power conversion system module shown in FIG. 1A, in accordance with some example embodiments.

FIG. 1D illustrates a side view of the low profile power conversion system module 100 shown in FIG. 1A. Here, the input/output terminals 130 can again be seen shaped as many small squares. Therefore, in this embodiment, the input/output terminals 130 extend from the top surface of the embedded power substrate to the side surface to the bottom surface of the embedded power substrate. In other embodiments, the input/output terminals 130 can be limited to fewer surfaces of the embedded power substrate 120, depending on the configuration of the mating electrical terminals. For example, in one embodiment, the input/output terminals 130 can be limited to only the side surface of the embedded power substrate 120, so that the input/output terminals 130 do not extend to the top and the bottom surfaces.

Figure 2A:
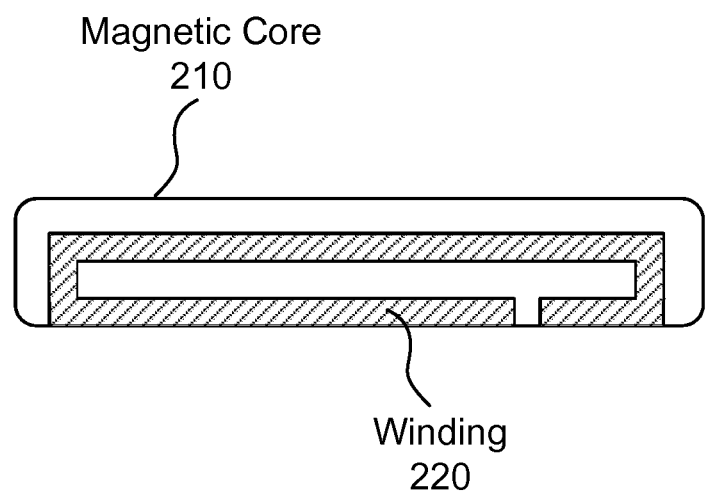
FIG. 2A illustrates a cross sectional view of a magnetic component associated with a low profile power conversion system module, in accordance with some example embodiments.
Figure 2B:
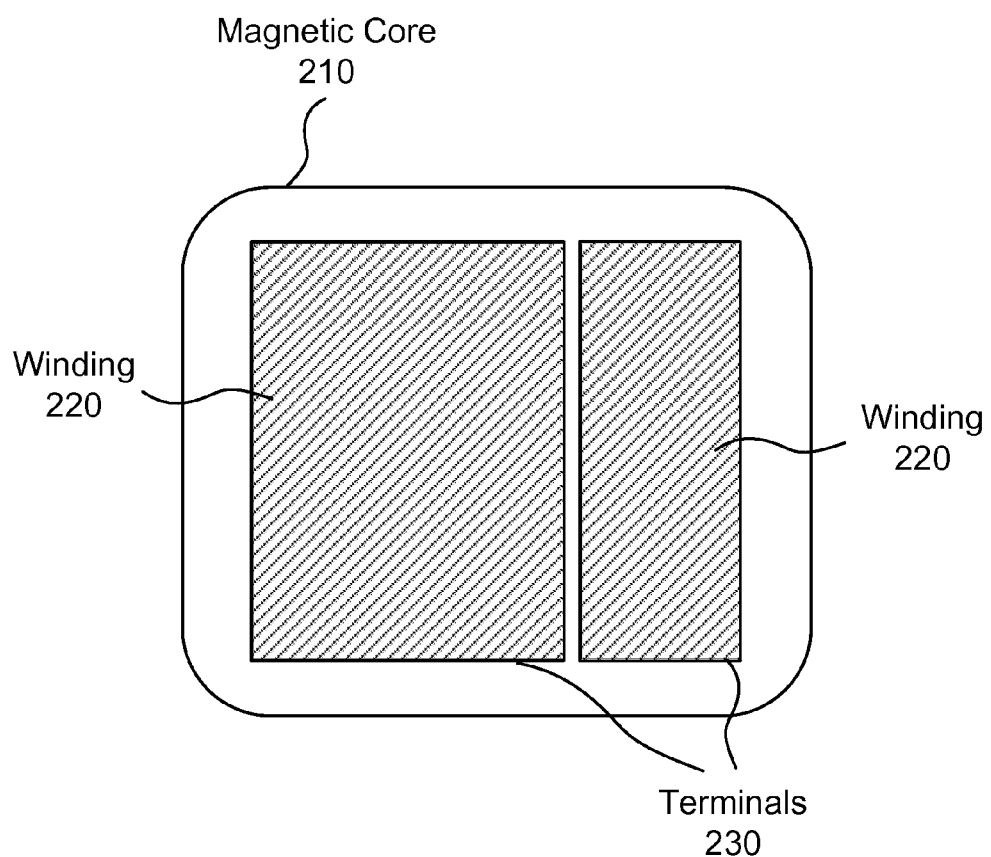
FIG. 2B illustrates a bottom view of the magnetic component shown in FIG. 2A, in accordance with some example embodiments.

FIG. 2A illustrates a cross sectional view of an embodiment of a magnetic component 200 associated with a low profile power conversion system module. FIG. 2B illustrates a bottom view of the magnetic component 200 shown in FIG. 2A. The magnetic component 200 is shown as a magnetic core 210 with embedded winding 220. FIG. 2B also shows terminals 230 to the winding 220.

In one embodiment, special attention is paid to the use of low profile magnetic components that serve not only as energy-storage and/or energy-transformation device, but also provide thermal interface to dissipate heat generated by the power converter. In one embodiment, the windings and terminals of the low profile magnetic components are designed to reduce power loss and provide good thermal/electrical contact to the embedded power substrate. In one embodiment, being shielded and covering the entire switching power stage, the magnetic structure help to reduce EMI (electromagnetic interference) problems.

Figure 3:
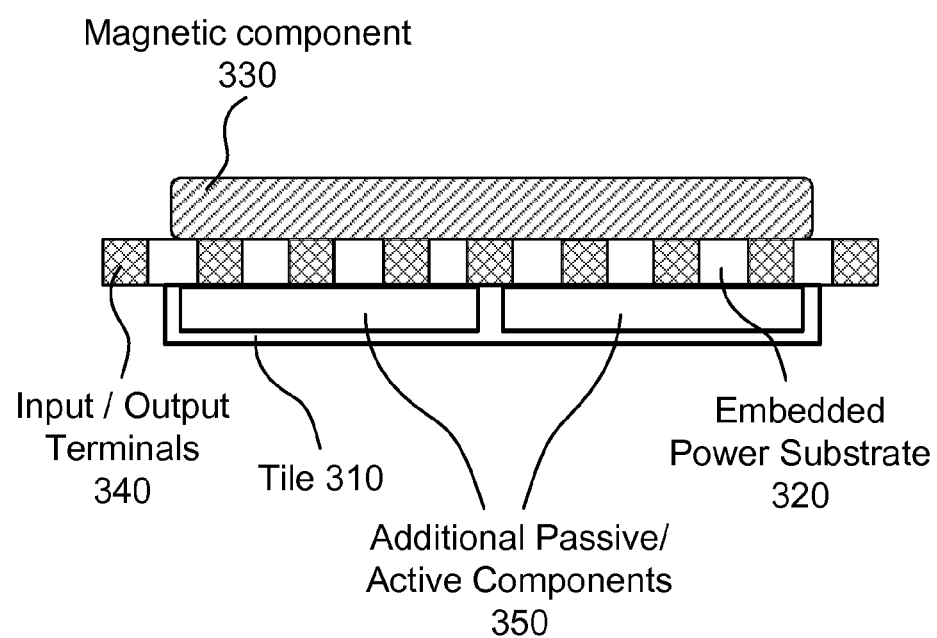
FIG. 3 illustrates a side view of a low profile power conversion system module that has a tile with additional passive/active components disposed below the embedded power substrate, in accordance with some example embodiments.

FIG. 3 shows one embodiment of a low profile power conversion system module 300, where a tile 310 can be assembled to be disposed below an embedded power substrate 320. Additionally, a magnetic component 330 can be assembled to be disposed above the embedded power substrate 320. Further, input/output terminals 340, shaped as small squares, can be seen disposed on a side of the embedded power substrate 320. Input/output terminals 340 can provide electrical connections to the magnetic component 330, as well as to switching power devices and other active/passive devices embedded within the power substrate 320 and tile 310. In one embodiment, the tile 310 can be a plastic package device. In another embodiment, this can be additional PCB. In one embodiment, this additional PCB of tile 310 can be similar to the PCB used for the embedded power substrate 320. In one embodiment, this tile 310 can contain additional passive/active components 350. In one embodiment, this tile can contain only input and output filter capacitors, and be known as a filter tile.

Figure 4:
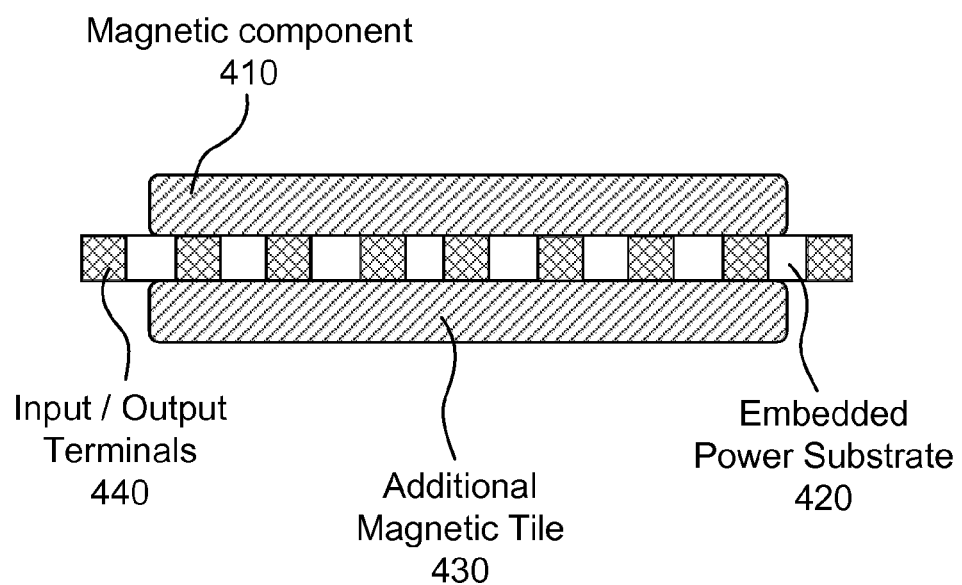
FIG. 4 illustrates a side view of a low profile power conversion system module that has magnetic tiles disposed both above and below an embedded power substrate, in accordance with some example embodiments.

FIG. 4 shows one embodiment of a low profile power conversion system module 400, where magnetic components (410 and 430) can be assembled to be disposed both above and below an embedded power substrate 420. Input/output terminals 440 can provide electrical connections to the magnetic components (410 and 430), as well as to switching power devices and other active/passive devices embedded within the power substrate 420. In FIG. 4, magnetic component (or tile) 410 is disposed above the embedded power substrate 420, while magnetic component (or tile) 430 is disposed below the embedded power substrate 420. This is so that magnetic components can be mounted both above and below the embedded power substrate. In one embodiment, this can form a two phase converter, where the converter can be buried in a PCB (corresponding to the embedded power substrate) and one inductor is on top of the PCB and another inductor is on the bottom of the PCB. In one embodiment, this can form two independent outputs. In one embodiment, this can form two transformers.

Figure 5:
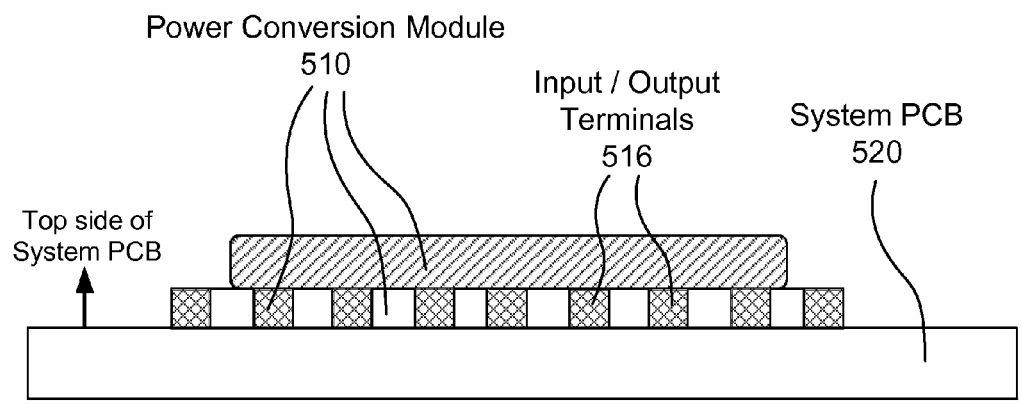
FIG. 5 illustrates a cross sectional view of a low profile power conversion system module assembled on a top surface of a system PCB (printed circuit board), in accordance with some example embodiments.
Figure 6:
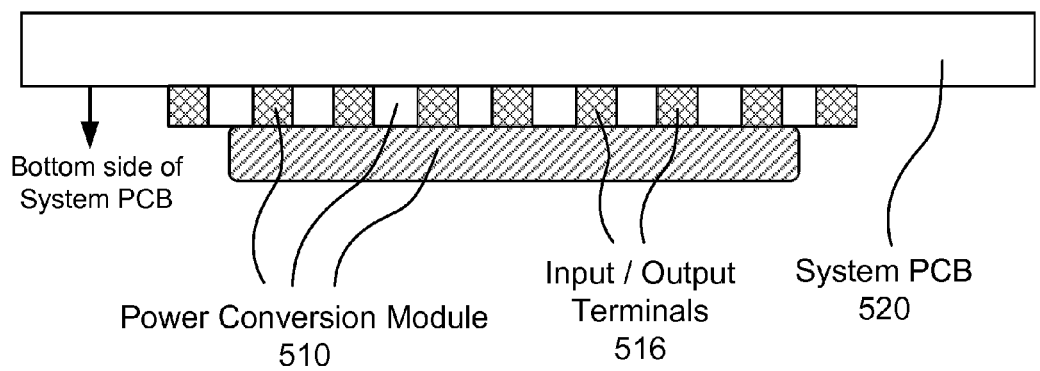
FIG. 6 illustrates a cross sectional view of a low profile power conversion system module assembled on a bottom surface of a system PCB, in accordance with some example embodiments.

FIG. 5 shows one embodiment, where a low profile power conversion system module 510 is assembled, like a surface mount component, on a top side of a system PCB (printed circuit board) 520. Alternatively, in another embodiment, the low profile power conversion system module 510 is assembled on the bottom side of the system PCB 520, as shown in FIG. 6. The module 510 can be assembled to be either on the top side or the bottom side of the system PCB 520, depending on which side has available space to accommodate the module 510. It is not shown, but in other embodiments, when the module is assembled to be on the top side of the system PCB, additional passive/active components can be disposed to be on the bottom side of system PCB. In still other embodiments, when the module is assembled to be on the bottom side of the system PCB, additional passive/active components can be disposed to be on the top side of system PCB. Further, in FIGS. 5 and 6, the system PCB 520 can be electrically coupled to the power conversion system module 510 via input/output terminals 516.

Figure 7:
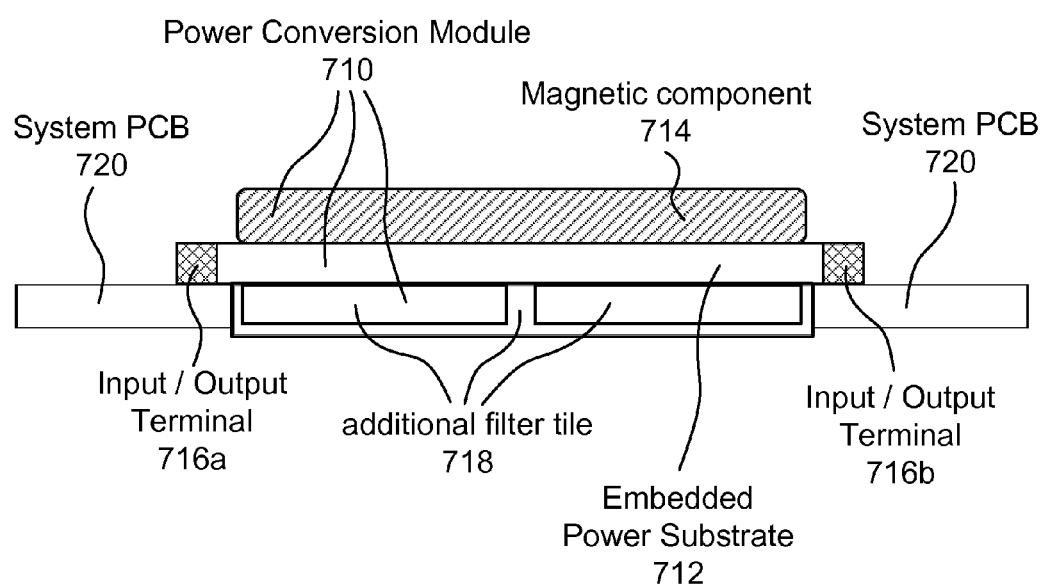
FIG. 7 illustrates a low profile power conversion system module assembled on a top surface of a system PCB with a cavity, in accordance with some example embodiments.

FIG. 7 shows another embodiment for mounting the module. In this embodiment, material is cut out from the system PCB to form a cavity. The cavity can be fashioned to fit a filter tile that is part of a low profile power conversion system module. When the module is dropped into the cavity, input/output terminals can also form electrical connections with the system PCB. In FIG. 7, a power conversion system module 710 is shown. The power conversion system module 710 is assembled with an additional filter tile 718. The power conversion system module 710 also includes an embedded power substrate 712, a magnetic component 714, and input/output terminals 716*a* and 716*b* for enabling electrical connection to the electrical and magnetic components of module 710. FIG. 7 shows that material has been cut out from a system PCB 720 to form a cavity that is now occupied by additional filter tile 718. In FIG. 7, it can be seen the footprint of additional filter tile 718 is smaller than the footprint of embedded power substrate 712. This means that the embedded power substrate 712 extends beyond the cavity occupied by the additional filter tile 718. In FIG. 7, it can be seen that input/output terminals 716*a* and 716*b* extend beyond the cavity so that they can form electrical connections with the system PCB 720. FIG. 7 only shows that the embedded power substrate 712 extends beyond the cavity in the x-direction, but in one embodiment the embedded power substrate 712 can also extend beyond the cavity in the y-direction.

Figure 8:
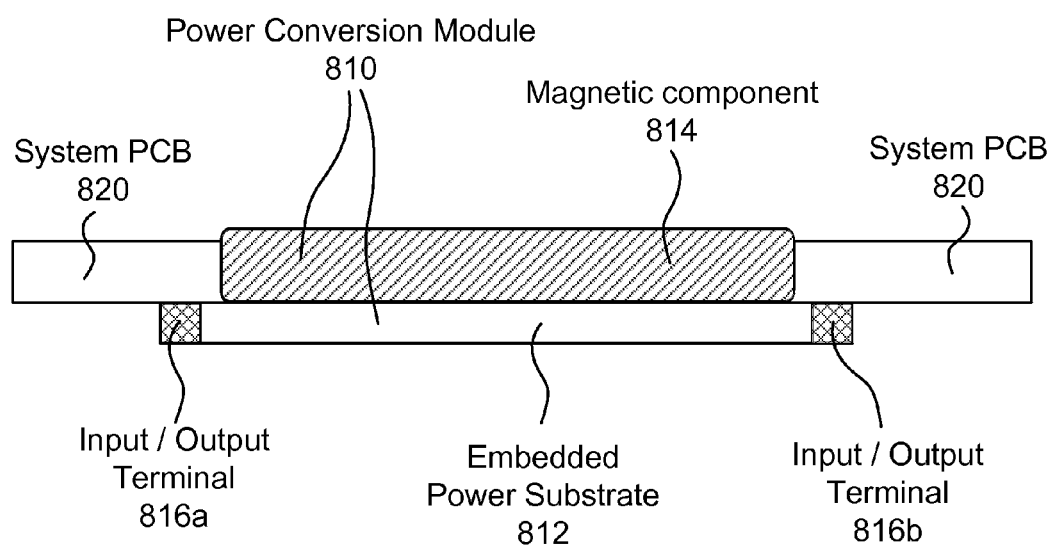
FIG. 8 illustrates a low profile power conversion system module assembled on a bottom surface of a system PCB with a cavity, in accordance with some example embodiments.

FIG. 8 shows yet another embodiment for mounting the module on a system PCB with a formed cavity. In this embodiment, the module is assembled to the system PCB from the bottom side so that the magnetic component is made to fit into the cavity. Again, when the module is disposed into the cavity, input/output terminals can form electrical connections with the system PCB. If there is more space available on the bottom side of the system PCB, an additional filter tile can be assembled to be affixed to the module as shown in FIG. 9.

In FIG. 8, a power conversion system module 810 is shown. The power conversion system module 810 includes an embedded power substrate 812, a magnetic component 814, and input/output terminals 816*a* and 816*b* for enabling electrical connection to the electrical and magnetic components of module 810. FIG. 8 shows that material has been cut out from a system PCB 820 to form a cavity that is now occupied by the magnetic component 814. In FIG. 8, it can be seen the footprint of magnetic component 814 is smaller than the footprint of embedded power substrate 812. This means that the embedded power substrate 812 extends beyond the cavity occupied by the magnetic component 814. In FIG. 8, it can be seen that input/output terminals 816*a* and 816*b* extend beyond the cavity so that they can form electrical connections with the system PCB 820. FIG. 8 only shows that the embedded power substrate 812 extends beyond the cavity in the x-direction, but in one embodiment the embedded power substrate 812 can also extend beyond the cavity in the y-direction.

Figure 9:
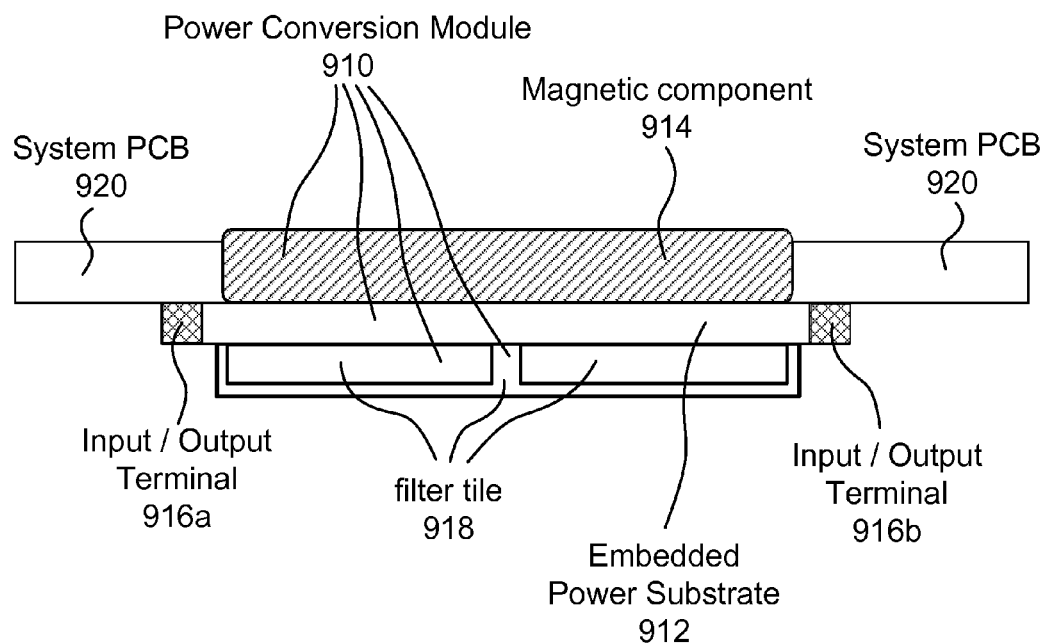
FIG. 9 illustrates a low profile power conversion system module with a filter tile assembled on a bottom surface of a system PCB with a cavity, in accordance with some example embodiments.

FIG. 9 shows a power conversion system module 910 that includes an embedded power substrate 912, a magnetic component 914, a filter tile 918, and input/output terminals 916*a* and 916*b* for enabling electrical connection to the electrical and magnetic components of module 910. FIG. 9 also shows that material has been cut out from a system PCB 920 to form a cavity that is now occupied by the magnetic component 914. FIG. 9 is similar to FIG. 8, except an additional filter tile is affixed to the power conversion system module 910 below the embedded power substrate 912. This embodiment is useful, when there is more space available on the bottom side of the system PCB 920 and an additional tile, such as a filter tile 918, is needed.

Figure 10:
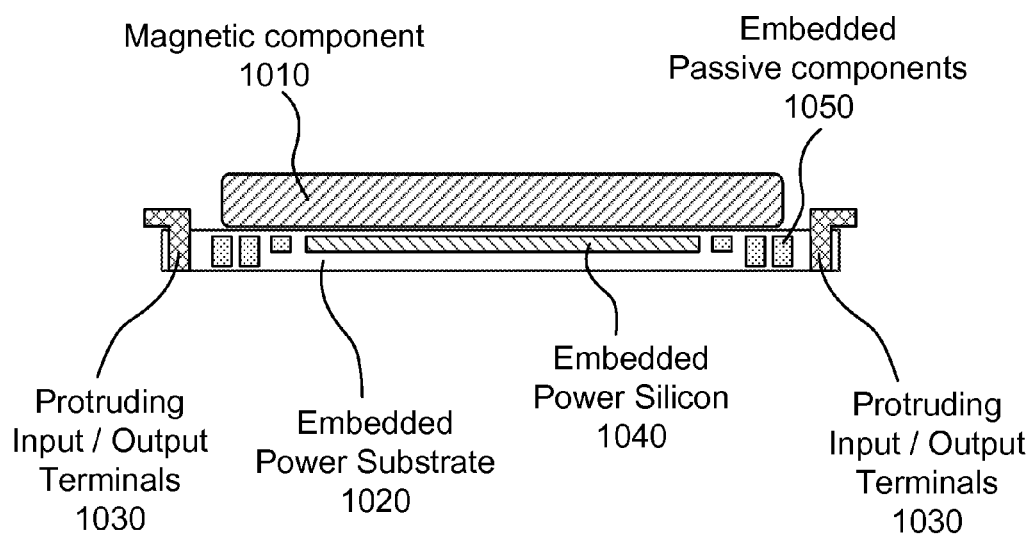
FIG. 10 illustrates input/output terminals protruding above an embedded power substrate associated with a low profile power conversion system module, in accordance with some example embodiments.
Figure 11:
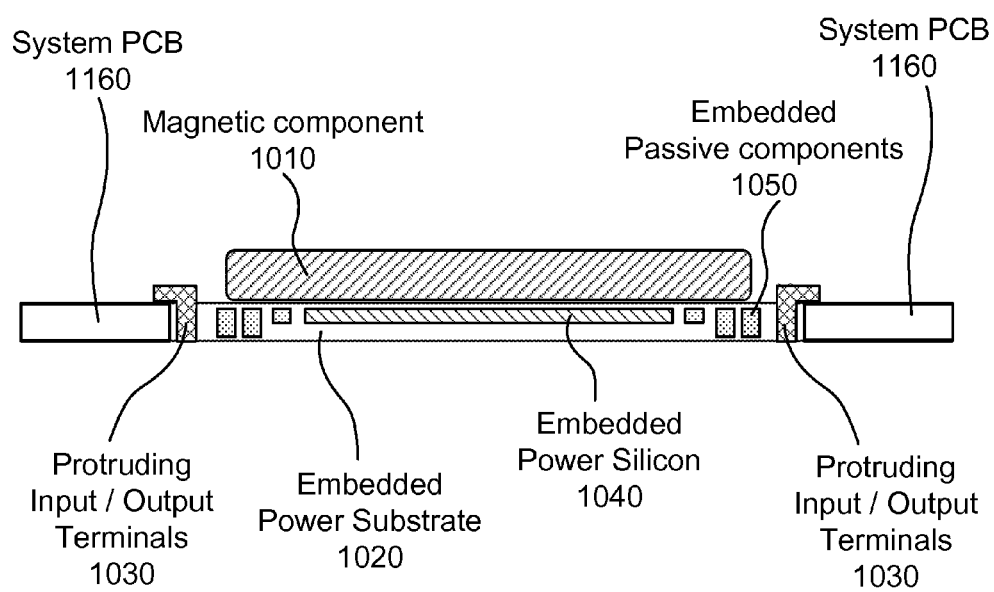
FIG. 11 illustrates how a low profile power conversion system module with protruding input/output terminals can be connected to a system PCB with a cavity, in accordance with some example embodiments.
Figure 12:
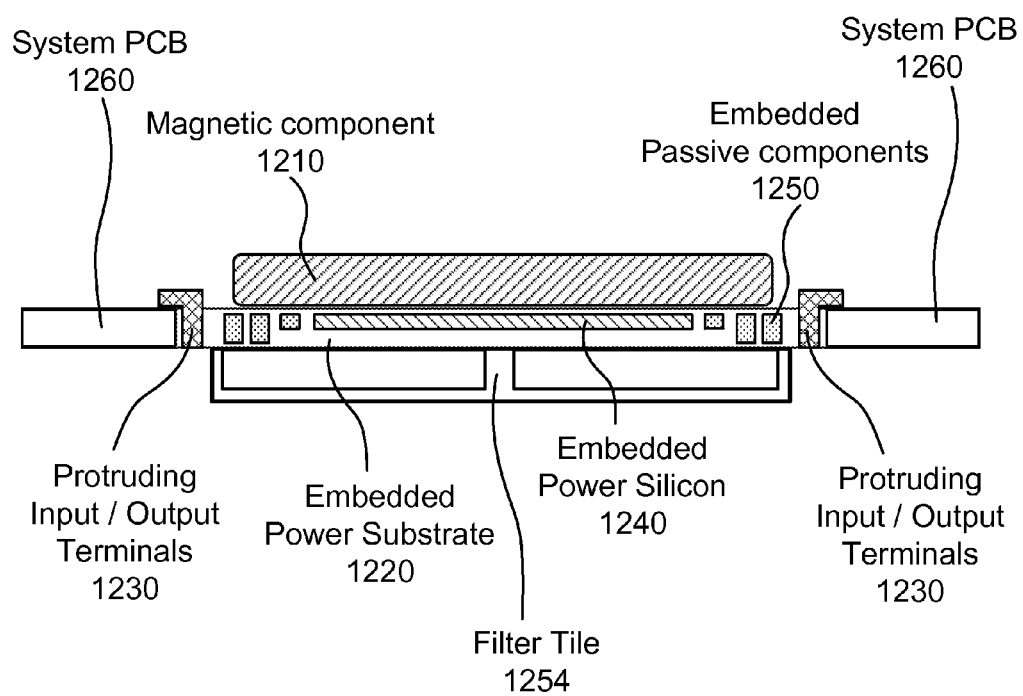
FIG. 12 illustrates how a low profile power conversion system module with a filter tile and protruding input/output terminals can be connected to a system PCB with a cavity, in accordance with some example embodiments.

In FIG. 1, input/output terminals are shown to be coplanar with the embedded power substrate. Alternatively, the input/output terminals or input/output pins can also be straight pins or elongated pins or c-clamps. FIG. 10 shows one embodiment, where input/output terminals are L-shaped pins which protrude above the embedded power substrate. The out stretched part of the L-shaped pins can be used to hang onto a system PCB and make electrical connection with the system PCB, as shown in FIG. 11. In FIG. 11, the out stretched part of the L-shaped pins can be soldered onto the system PCB. The height of the out stretched part of the L-shaped pins can also be adjusted to accommodate for the thickness of the system PCB. FIG. 12 shows further embodiments where a filter tile can be added to the bottom side of the module, when there is space available on the bottom side of the system PCB.

FIG. 10 shows a low profile power conversion system module 1000 that includes an embedded power substrate 1020, a magnetic component 1010, an embedded power silicon 1040, embedded passive components 1050, and protruding input/output terminals 1030 for enabling electrical connection to the electrical and magnetic components of module 1000. FIG. 11 illustrates how a low profile power conversion system module with protruding input/output terminals, such as the power conversion system module

1000 shown in FIG. 10, can be connected to a system PCB with a cavity, in accordance with some example embodiments. FIG. 11 shows that the power conversion system module 1000 can be placed inside a cavity formed in a system PCB 1160 for saving vertical space. FIG. 11 further shows that that the out stretched part of the L-shaped pins (associated with the protruding input/output terminals 1030) is used to hang onto the system PCB 1160 and make electrical connection with the system PCB 1160. FIG. 12 shows how a low profile power conversion system module with a filter tile and protruding input/output terminals can be connected to a system PCB with a cavity, in accordance with some example embodiments. The low profile power conversion system module of FIG. 12 includes an embedded power substrate 1220, a magnetic component 1210, an embedded power silicon 1240, embedded passive components 1250, protruding input/output terminals 1230, and a filter tile 1254. FIG. 12 shows that the power conversion system module can be placed inside a cavity formed in a system PCB 1260, using the protruding input/output terminals 1030 to hang onto the system PCB 1260 and make electrical connection.

The system PCB cavity for accommodating a module can be a partial cavity or a complete cavity. In the complete cavity, the cavity depth is through the entire PCB so an opening is formed in the PCB. In the partial cavity, the cavity depth is less than the thickness of the PCB, so no opening is formed in the PCB. Therefore, the depth of the partial cavity can be varied according to the specific application. Furthermore, the shape of the partial and complete cavity can also be varied. In one embodiment, the cavity can have a step to accommodate the module. In that case, the module can directly sit on the step or the module can have a mating step to latch onto the step. In one example, the module itself can have an interleave, as it is a 4-layer PCB. In that case, the module PCB can be cut half way down, forming a shelf. Then a mating shelf can be formed on the attaching system PCB. In other embodiments, other mating structures can also be devised.

In FIG. 10, the input/output terminals or pins are shown to be protruding above the embedded power substrate. In other embodiments, the input/output terminals can be protruding below the embedded power substrate. In still other embodiments, the input/output terminals can be both protruding above and below the embedded power substrate. In other embodiments, input/output terminals can be a straight pin with no out-stretching structure, or a completely differently shaped pin.

In FIG. 12, the module has only one built-in converter. In other embodiments, more converters can be built into a single module with multiple outputs or multiple pins and high current. In one embodiment, these multiple converters can be assembled to be disposed side by side each other on the system PCB.

Figure 13:
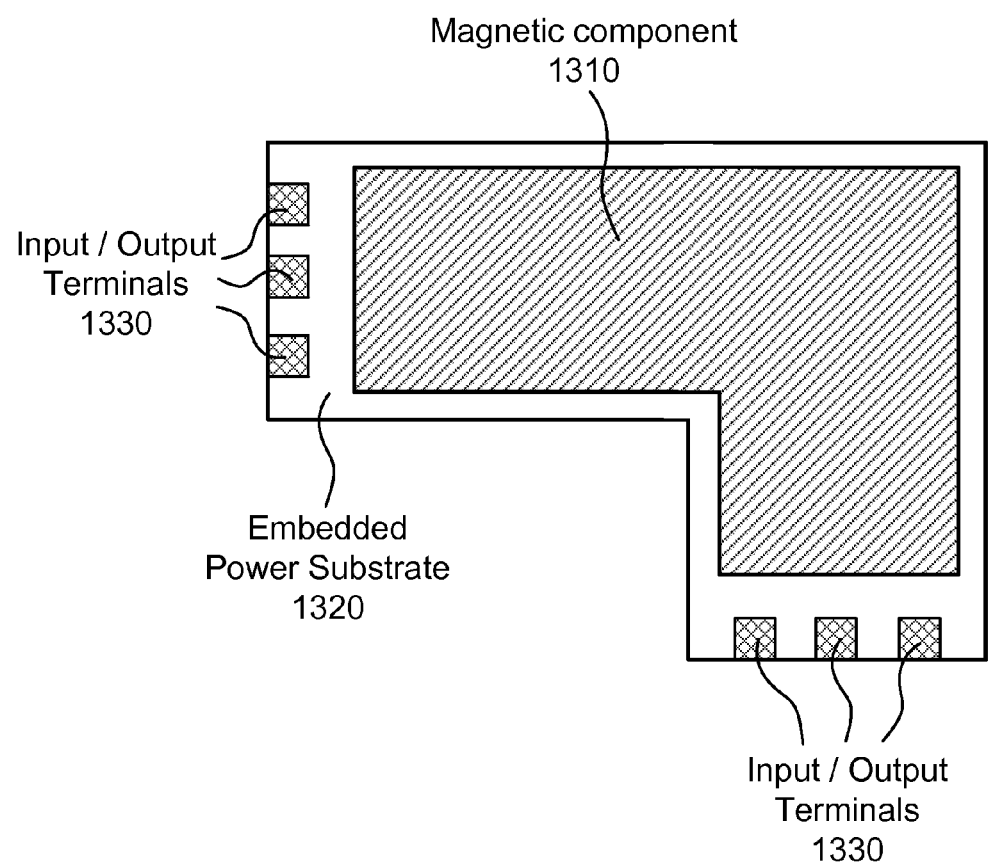
FIG. 13 illustrates that a low profile power conversion system module can be customized to be any shape (e.g. this module is customized to be an "L" shape), in accordance with some example embodiments.

There is flexibility to make the magnetic component into any shape, other than the rectangular plane shown in FIG. 1A. In FIG. 13, the magnetic component is made into an "L" shape to accommodate the space requirements and constrains of the computer/electronic systems. For example, the "L" shape might fit very well into an unused corner. This flexibility in shape enables customized magnetic components to be made, instead of relying on current off the shelf components which are designed to standard shapes that maintain industry standard footprint. In one embodiment, this magnetic component can be made into a transformer or an inductor. FIG. 13 shows that a low profile power conversion system module 1300 can include an embedded power substrate 1320, a magnetic component 1310, and protruding input/output terminals 1330 for enabling electrical connection to the electrical and magnetic components of module 1300.

Figure 14:
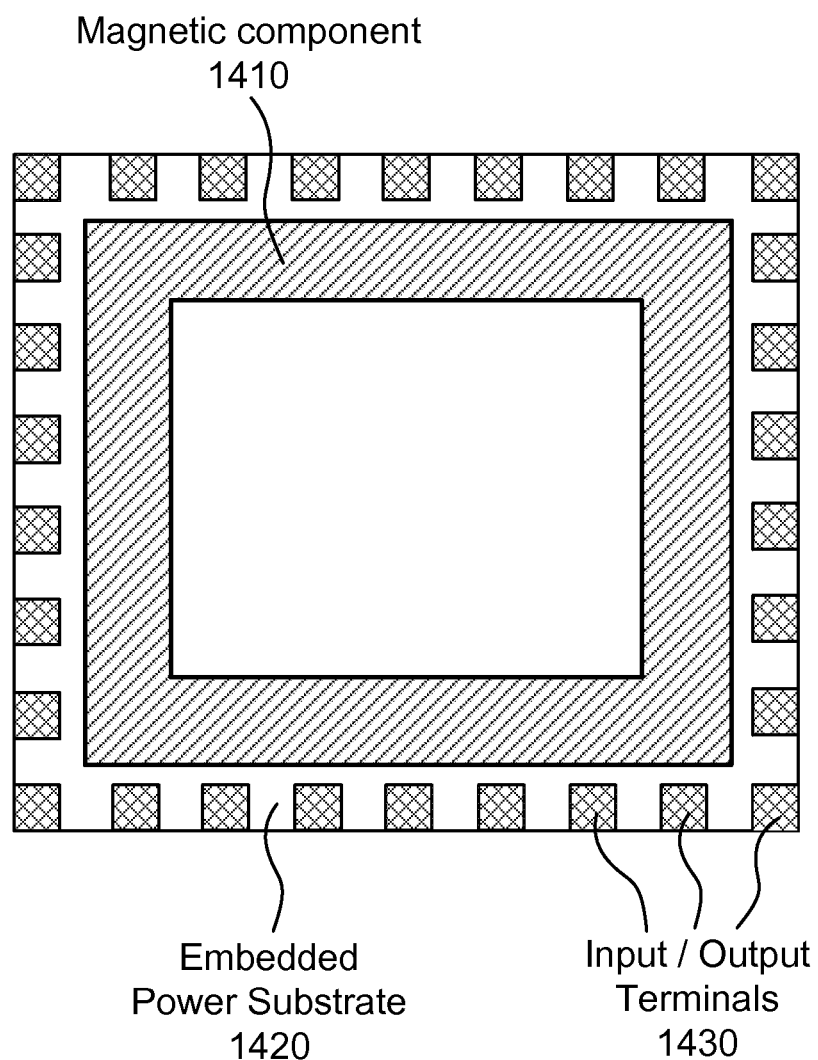
FIG. 14 illustrates a low profile power conversion system module with a rectangular donut shaped magnetic component, in accordance with some example embodiments.
Figure 15:
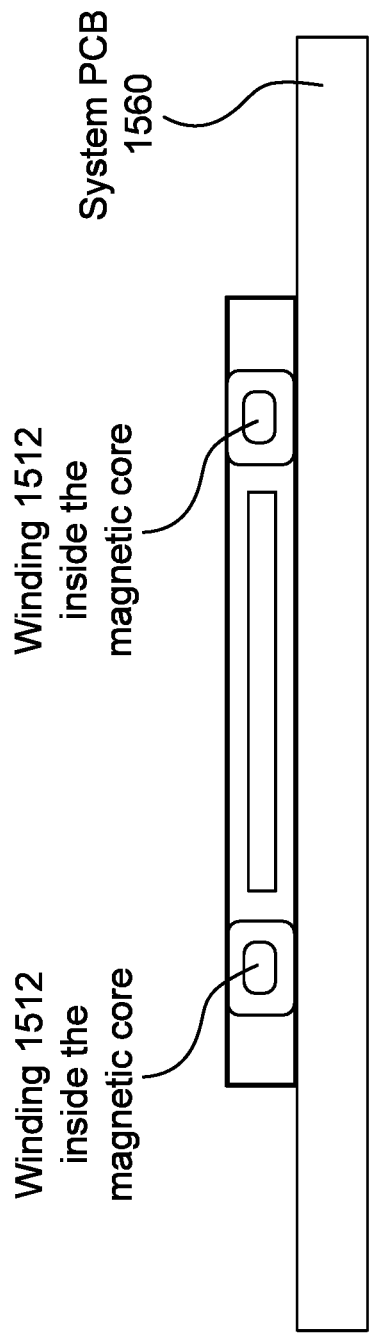
FIG. 15 illustrates a cross sectional view of the module shown in FIG. 14 assembled on a top surface of a system PCB, in accordance with some example embodiments.

FIG. 14 illustrates an example to make a custom magnetic component that is shaped like a rectangular donut. In this example, the magnetic component can also be embedded inside the PCB, as shown in FIG. 15. In FIG. 15, a cross section of the custom magnetic component is shown. Here, an inductor is formed from windings 1512 inside the core. The windings 1512 are inside the rectangular donut with two breakouts for the terminals, which can be connected to a system PCB 1560. This approach has the advantage that everything is embedded within the PCB, so the module can fit in configurations where there is very little height space available. FIG. 14 shows that a low profile power conversion system module 1400 can include an embedded power substrate 1420, a magnetic component 1410, and protruding input/output terminals 1430 for enabling electrical connection to the electrical and magnetic components of module 1400.

Figure 16:
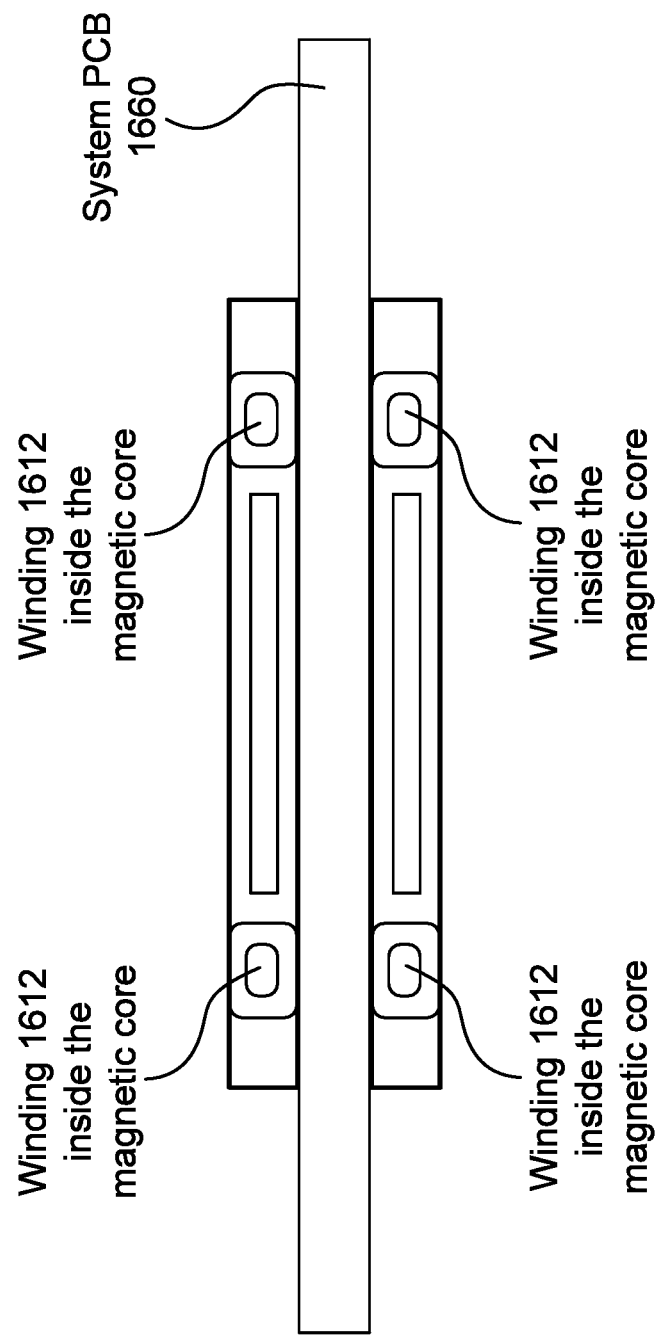
FIG. 16 illustrates a cross sectional view of two modules assembled on both a top and a bottom surface of a system PCB, in accordance with some example embodiments.
Figure 17:
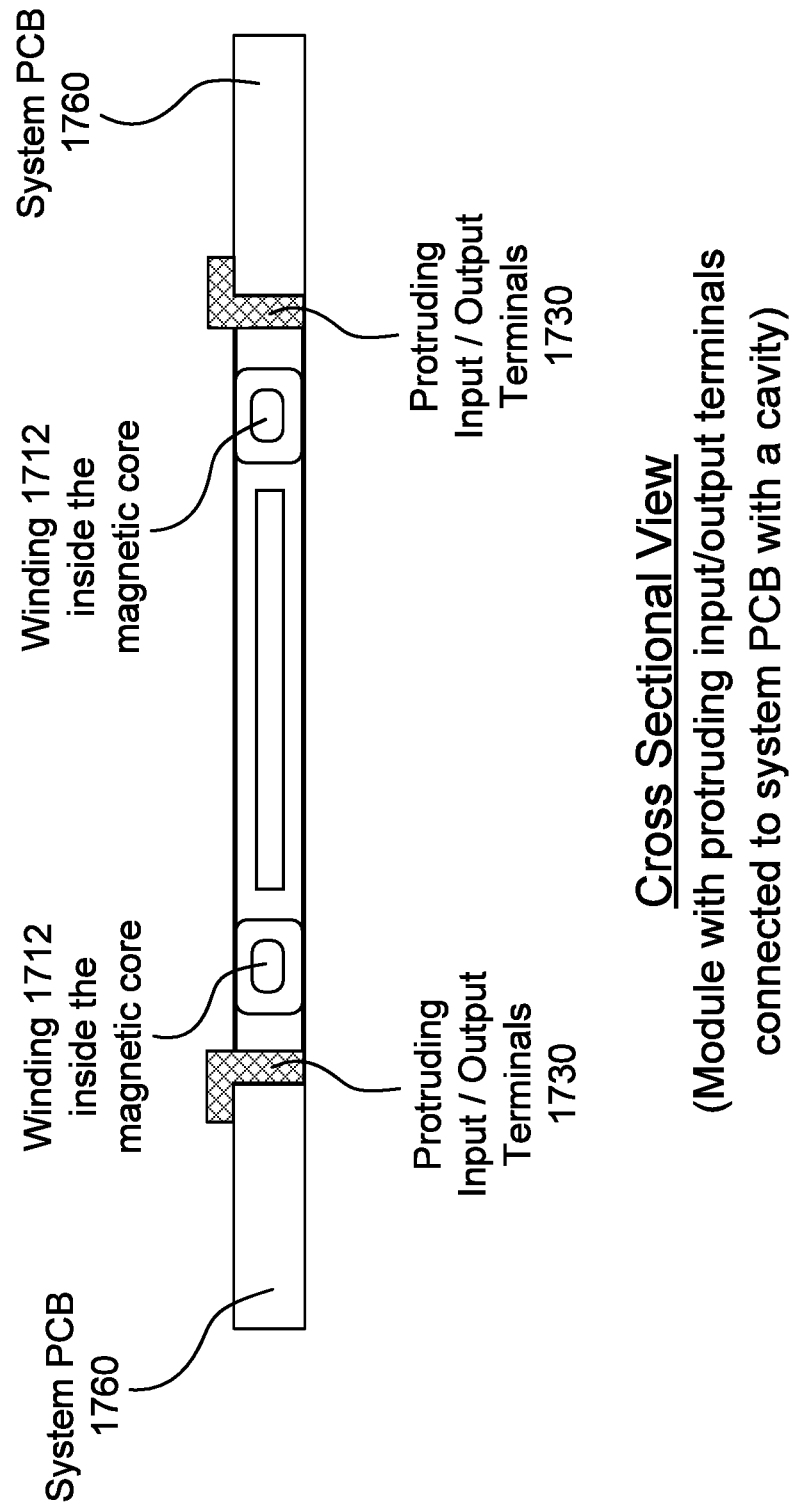
FIG. 17 illustrates a module (similar to the one shown in FIG. 15) assembled on a top surface of a system PCB with a cavity and electrically connected to the system PCB via protruding input/output terminals, in accordance with some example embodiments.
Figure 18:
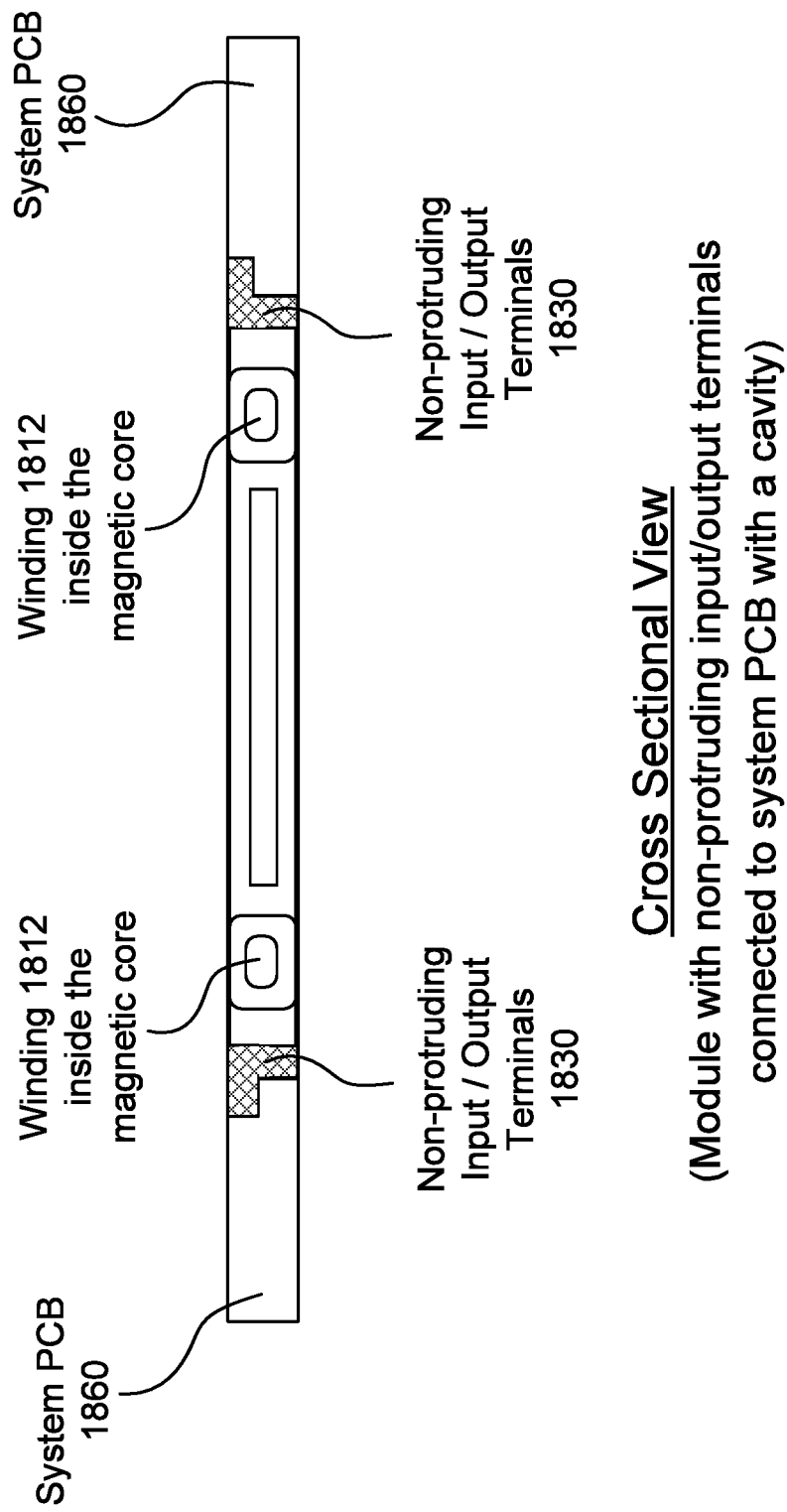
FIG. 18 illustrates a module (similar to the one shown in FIG. 15) assembled on a top surface of a system PCB with a cavity and electrically connected to the system PCB via non-protruding input/output terminals, in accordance with some example embodiments.

In FIG. 16, an additional module (or tile) is added to the bottom surface of the system PCB, so that this can be two separate converters or a multi-phase converter providing high current. If there is no height space available, a cavity can be formed in the system PCB so that the module can fit in the cavity with protruding input/output terminals, as shown in FIG. 17. In other embodiment, the module can fit in the cavity with non-protruding input/output terminals, as shown in FIG. 18. In FIG. 18, the cavity is formed with a step and the input/output terminal is also formed with a step, so the two steps can form a tight fit when the module is dropped into the cavity.

FIG. 16 illustrates a cross sectional view of two modules assembled on both a top and a bottom surface of a system PCB, in accordance with some example embodiments. In FIG. 16, the magnetic components are embedded inside the two modules. Inductors are formed from windings 1612 inside the magnetic core. The windings 1612 have breakouts for the terminals, which can be connected to a system PCB 1660. The configuration of FIG. 16 allows for a very low z height, since everything is embedded within the embedded power substrate and there is no magnetic component disposed on top of the embedded power substrate, adding to the z height.

FIG. 17 illustrates a module (similar to the one shown in FIG. 15) assembled on a top surface of a system PCB with a cavity and electrically connected to the system PCB via protruding input/output terminals, in accordance with some example embodiments. FIG. 17 shows that a module (similar to the one shown in FIG. 15) can be placed in inside a cavity formed in a system PCB 1760 for saving vertical space. FIG. 17 further shows that protruding input/output terminals 1730 can be used to hang onto the system PCB 1760 and make electrical connection with the system PCB 1760. In FIG. 17, windings 1712 inside the magnetic core are used to form magnetic components.

FIG. 18 illustrates a module (similar to the one shown in FIG. 15) assembled on a top surface of a system PCB 1860 with a cavity and electrically connected to the system PCB 1860 via non-protruding input/output terminals 1830, in accordance with some example embodiments. The FIG. 18 module is very similar to the FIG. 17 module, but the FIG. 18 module can provide more vertical space savings, because the input/output terminals 1830 are non-protruding. However, a step has to be fashioned in the cavity of the system PCB 1860, so that the non-protruding input/output terminals 1830 can hang onto the system PCB 1860 and make electrical connection with the system PCB 1860. Further, in FIG. 18, windings 1812 inside the magnetic core are used to form magnetic components.

Figure 19:
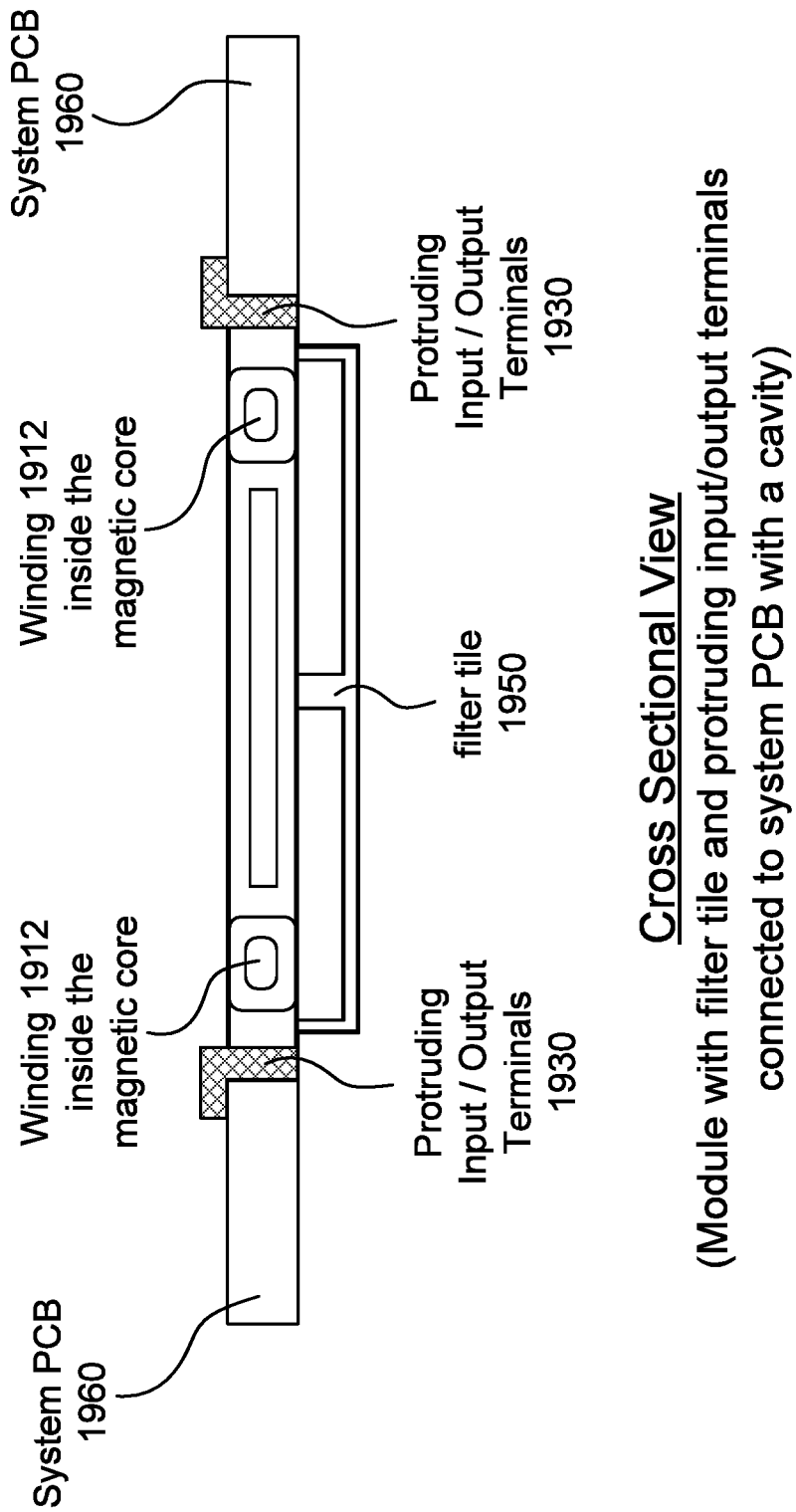
FIG. 19 illustrates a module (similar to the one shown in FIG. 15, but with an additional filter tile) assembled on a top surface of a system PCB with a cavity and electrically connected to the system PCB via protruding input/output terminals, in accordance with some example embodiments.

FIG. 19 illustrates a module (similar to the one shown in FIG. 15, but with an additional filter tile 1950) assembled on a top surface of a system PCB 1960 with a cavity and electrically connected to the system PCB 1960 via protruding input/output terminals 1930, in accordance with some example embodiments. In FIG. 19, the module is placed inside a cavity formed in a system PCB 1960 for saving vertical space. Windings 1912 inside the magnetic core are used to form magnetic components. The addition of filter tile 1950 illustrates the concept to mix and match various available components for optimizing and tailoring the module to specific needs.

Figure 20:
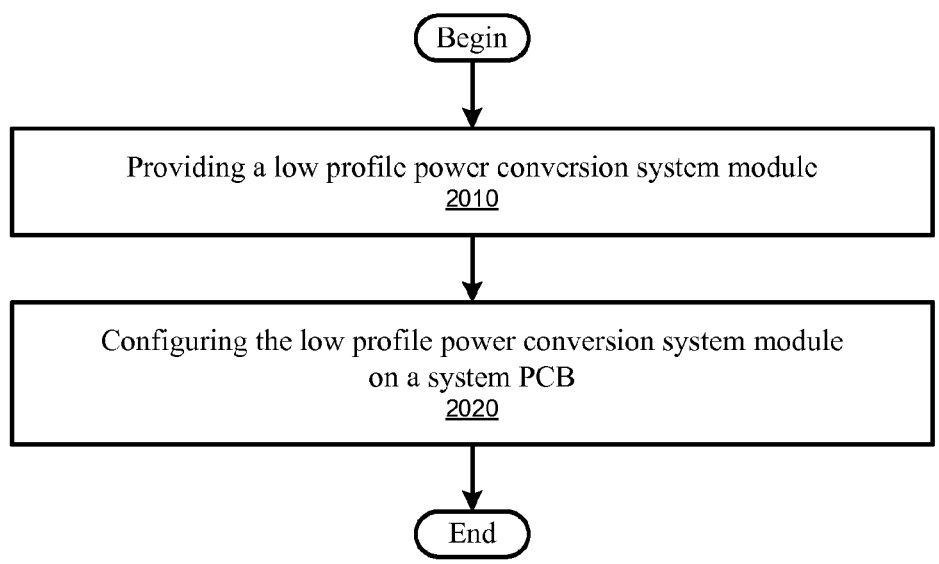
FIG. 20 shows a flow chart of method steps for using a low profile power conversion system module, in accordance with some example embodiments.

FIG. 20 is a flow chart of a method 2000 for using a low profile power conversion system module, in accordance with some example embodiments. As shown in FIG. 20, the method 2000 begins at step 2010, where the method provides the low profile power conversion system module. Then, at step 2020, the method configures the low profile power conversion system module on a system PCB (printed circuit board). The method 2000 allows for packaging and assembly of a low profile power conversion system module that can be employed to operate in space constrained (e.g., restricted z height) environment such as ultraportable notebook computers, tablet computers, and smartphones. The low profile power conversion system module can be employed in a space constrained (e.g., restricted z height) environment, because the low profile module is thin planar-shaped. In particular, the low profile power conversion system module includes an embedded power substrate, an embedded power silicon disposed within the embedded power substrate, a magnetic component which is either embedded within the embedded power substrate or disposed on top of the embedded power substrate, and input/output terminals disposed on a side of the embedded power substrate. The input/output terminals are configured to supply power and signal to the embedded power silicon and the magnetic component. The embedded power substrate and the magnetic component are thin planar-shaped to allow for use in a space constrained (e.g., restricted z height) environment.

The packaging and assembly of a low profile power conversion system module described above uses embedded PCB to achieve a more compact and more uniform technique to make devices that can be employed to many space constrained applications. The present description focused on making thin planar shaped device which can be used in configurations where height space is limited. However, in configurations where board space is constrained and the height space is not constrained, similar techniques can be used to make tall vertical devices.

The disclosure described above concentrates on using surface connections and traces for a low profile power conversion system module and for a system PCB. However, in one embodiment, non-surface connections and traces, such as through-hole technology, can also be employed. In one embodiment, the electrical connections and traces can be within holes drilled in the PCB and the module. In one embodiment, the electrical connections and traces can be within the PCB and the module.

It will also be understood that various directional and orientational terms such as "vertical" and "horizontal", "top" and "bottom", "side", "height", and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A low profile power conversion system module comprising:
    an embedded power substrate, the embedded power substrate being thin planar-shaped;
    a first magnetic component disposed on a first surface of the embedded power substrate, the magnetic component being thin planar-shaped;
    an electrical component disposed on a second surface opposite the first surface of the embedded power substrate, wherein the electrical component comprises a second magnetic component, a printed circuit board, or packaging containing passive or active components;
    an embedded power silicon disposed within the embedded power substrate and between the magnetic component and the electrical component; and
    input/output terminals disposed on a side of the embedded power substrate, the input/output terminals configured to supply power and signal to the embedded power silicon, the electrical component, and the magnetic component.

2. The low profile power conversion system module of claim 1, wherein the embedded power substrate is comprised of PCB (printed circuit board).

3. The low profile power conversion system module of claim 1, further comprising of an embedded passive component disposed within the embedded power substrate.

4. The low profile power conversion system module of claim 1, wherein the first magnetic component is comprised of a magnetic core with embedded winding and wherein the electrical component is a passive electrical component or an active electrical component contained within plastic packaging.

5. The low profile power conversion system module of claim 1, wherein the input/output terminals are co-planar with the embedded power substrate and are protruding above the embedded power substrate.

6. The low profile power conversion system module of claim 1, wherein the electrical component is mounted to a printed circuit board.

7. The low profile power conversion system module of claim 1, wherein the power conversion system module is disposed on a top surface of a system PCB (printed circuit board).

8. The low profile power conversion system module of claim 1, wherein the power conversion system module is disposed on a bottom surface of a system PCB (printed circuit board).

9. The low profile power conversion system module of claim 1, wherein the power conversion system module is disposed to be partially within an opening formed in a system PCB (printed circuit board).

10. A method for using a low profile power conversion system module, the method comprising:
providing the low profile power conversion system module, wherein the low profile power conversion system module comprises:
an embedded power substrate, the embedded power substrate being thin planar-shaped,
a first magnetic component disposed on a first surface of the embedded power substrate, the magnetic component being thin planar-shaped,
an electrical component disposed on a second surface opposite the first surface of the embedded power substrate, wherein the electrical component comprises a second magnetic component, a printed circuit board, or packaging containing passive or active components,
an embedded power silicon disposed within the embedded power substrate and between the magnetic component and the electrical component, and
input/output terminals disposed on a side of the embedded power substrate, the input/output terminals configured to supply power and signal to the embedded power silicon, the electrical component, and the magnetic component; and
configuring the low profile power conversion system module on a system PCB (printed circuit board).

11. The method of claim 10, wherein the module further comprises:
an embedded passive component disposed within the embedded power substrate.

12. The method of claim 10, wherein the magnetic component is comprised of a magnetic core with embedded winding.

13. The method of claim 10, wherein the input/output terminals are co-planar with the embedded power substrate.

14. The method of claim 10, wherein the input/output terminals are protruding above the embedded power substrate.

15. The method of claim 10, wherein configuring the low profile power conversion system module on a system PCB comprises:
disposing the power conversion system module on a top surface of the system PCB.

16. The method of claim 10, wherein configuring the low profile power conversion system module on a system PCB comprises:
disposing the power conversion system module on a bottom surface of the system PCB.

17. The method of claim 10, wherein configuring the low profile power conversion system module on a system PCB comprises:
disposing the power conversion system module partially within an opening formed in the system PCB.

18. A power conversion device comprising:
an embedded power substrate, the embedded power substrate being thin planar-shaped;
a power silicon disposed within the embedded power substrate and surrounded by other components comprising:
a magnetic component disposed within the embedded power substrate at one side of the power silicon, and
an electrical component disposed within the embedded power substrate at an opposite side of the power silicon; and
input/output terminals disposed on the side of the embedded power substrate, the input/output terminals configured to supply power and signal to at least the power silicon and the magnetic component and the electrical component.

19. The power conversion device of claim 18, wherein the embedded power substrate is comprised of PCB (printed circuit board).

20. The power conversion device of claim 18, wherein the magnetic component is comprised of a magnetic core with embedded winding.

\* \* \* \* \*